United States Patent
Takada

(10) Patent No.: US 6,578,256 B2
(45) Date of Patent: Jun. 17, 2003

(54) SUB-HARNESS AND A SUB-HARNESS MANUFACTURING APPARATUS

(75) Inventor: Kazuhiko Takada, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/265,774

(22) Filed: Oct. 8, 2002

(65) Prior Publication Data

US 2003/0057960 A1 Mar. 27, 2003

Related U.S. Application Data

(62) Division of application No. 09/826,363, filed on Apr. 5, 2001, now Pat. No. 6,486,677.

(30) Foreign Application Priority Data

Apr. 5, 2000 (JP) ......................................... 2000-103162

(51) Int. Cl.⁷ .......................... B23P 19/00; B23P 23/00; B21B 15/00; H01H 31/02
(52) U.S. Cl. ........................ 29/751; 29/33 F; 29/33 M; 29/747; 29/748; 29/749; 29/755; 29/857; 324/539; 324/541
(58) Field of Search .......................... 29/857, 33 F, 749, 29/755, 867, 556.3, 863, 864, 593, 748, 751, 764, 747, 750, 861, 33 M, 564.6, 564.4, 753; 324/539, 541, 542; 98/346.2

(56) References Cited

U.S. PATENT DOCUMENTS

| | | | |
|---|---|---|---|
| 3,859,724 A | 1/1975 | Folkenroth | 29/628 |
| 4,476,629 A | 10/1984 | Suzuki et al. | 29/863 |
| 4,486,950 A | 12/1984 | Weidler | 29/857 |
| 4,628,600 A | * 12/1986 | Gordon et al. | 29/861 |
| 4,638,549 A | * 1/1987 | Okazaki et al. | 29/564.4 |
| 5,082,253 A | 1/1992 | Suzuki et al. | 269/45 |
| 5,127,159 A | 7/1992 | Kudo et al. | 29/863 |
| 5,606,795 A | 3/1997 | Ohba et al. | 29/863 |
| 5,611,141 A | * 3/1997 | Takada et al. | 29/861 |
| 5,913,553 A | 6/1999 | Takada | 29/861 |
| 6,125,532 A | * 10/2000 | Takada | 29/857 |
| 6,195,884 B1 | * 3/2001 | Miyamoto et al. | 29/857 |
| 6,269,538 B1 | 8/2001 | Takada | 29/749 |
| 6,321,445 B1 | * 11/2001 | Suzuki et al. | 29/857 |
| 6,360,436 B1 | 3/2002 | Takada | 29/861 |

FOREIGN PATENT DOCUMENTS

| | | |
|---|---|---|
| JP | 7-161437 | 6/1995 |
| JP | 9-306257 | 11/1997 |
| JP | 10-41041 | 2/1998 |
| JP | 10-154568 | 6/1998 |

* cited by examiner

*Primary Examiner*—N. Le
*Assistant Examiner*—Wasseem H. Hamdan
(74) *Attorney, Agent, or Firm*—Armstrong, Westerman & Hattori, LLP

(57) ABSTRACT

A sub-harness and a sub-harness manufacturing apparatus including a pair of connecting units each having a wire connecting portion, made of metal, vertically movable so as to connect one end of one of a plurality of wires composing a sub-harness to one of a plurality of terminals having a sheathing clamping portion and being arranged in a wire feeding direction; and a pair of transferring devices to transfer the terminals in a direction perpendicular to the wire feeding direction so as to position each one of the plurality of terminals under each wire connecting portion. A clamping punch portion is provided on the wire connecting portion of each of the pair of connecting units for clamping the sheathing clamping portion and a conductivity testing device is arranged between the clamping punch portions of the pair of connecting units for judging whether the one of the plurality of wires having terminals on the respective ends thereof is good or bad.

6 Claims, 11 Drawing Sheets

SUB-HARNESS AND A SUB-HARNESS MANUFACTURING APPARATUS

This application is a division of prior application Ser. No. 09/826,363 filed Apr. 5, 2001, now U.S. Pat. No. 6,486,677 B2, patented on Nov. 26, 2002.

BACKGROUND OF THE INVENTION

1. Field of the Invention

The present invention relates to a conductivity testing method for a sub-harness to be arranged on a vehicle such as motor vehicle and to a sub-harness manufacturing apparatus.

2. Description of the Related Art

A pressure welding apparatus, which has a pair of frames with a pair of pressure welding units and a pair of connector tables so that many kinds of sub-harnesses composing a wiring harness can be effectively manufactured, is suggested in Japanese Patent Application Laid-open No. 10-154568.

The pressure welding apparatus enables a wire to be pressure-welded to a connector on one connector table, while supplying another connector on the other connector table. And, a sub-harness can be collected from the other connector table.

With respect to the above prior art, however, the sub-harness having been collected from the connector table is to be set on a conductivity test tool so that the conductivity can be tested through terminals connected on both ends. In case that conductivity defectiveness is found, many man-hours are required for its repair, thereby increasing the cost.

SUMMARY OF THE INVENTION

In view of the foregoing, an object of the present invention is to provide a conductivity testing method for a sub-harness and a sub-harness manufacturing apparatus, wherein a sub-harness can be efficiency manufactured and tested.

In order to achieve the above object, as a first aspect of the present invention, a conductivity testing method for a sub-harness in a sub-harness manufacturing process using a sub-harness manufacturing apparatus, the sub-harness manufacturing apparatus comprising: a pair of connecting units each having a wire connecting portion, made of metal, vertically movable so as to connect one end of one of wires comprising a sub-harness to one of terminals having a sheathing clamping portion and being arranged in a wire feeding direction; and a pair of transferring means to transfer the terminals in a direction perpendicular to the wire feeding direction so as to position each one of the terminals under each wire connection portions, wherein a clamping punch portion to clamp the sheathing clamping portion is provided on the wire connecting portion of each of the pair of connecting units, comprises the steps, in a connection process of connecting both ends of the one of the wires to the respective terminals, of: keeping one clamping punch portion having clamped the sheathing clamping portion onto one end of the one of the wires in contact with the sheathing clamping portion; keeping the other clamping punch portion having clamped the sheathing clamping portion onto the other end of the one of the wires in contact with the sheathing clamping portion; and testing conductivity between one and the other clamping punch portions so as to judge the one of the wires having the terminals on the respective ends being good or bad.

As a second aspect of the present invention, a sub-harness manufacturing apparatus comprises: a pair of connecting units each having a wire connecting portion, made of metal, vertically movable so as to connect one end of one of wires composing a sub-harness to one of terminals having a sheathing clamping portion and being arranged in a wire feeding direction; and a pair of transferring means to transfer the terminals in a direction perpendicular to the wire feeding direction so as to position each one of the terminals under each wire connecting portions, wherein a clamping punch portion to clamp the sheathing clamping portion is provided on the wire connecting portion of each of the pair of connecting units and a conductivity testing means to judge the one, having terminals on the respective ends thereof, of the wires being good or bad is arranged between the clamping punch portions of the pair of connecting units.

As a third aspect of the present invention, in the structure with the above second aspect, each of the pair of connecting units is provided with a holding means to keep the clamping punch portion in contact with the sheathing clamping portion.

As a fourth aspect of the present invention, in the structure with either one of the above first and second aspects, the sub-harness manufacturing apparatus further comprises: a controlling means to synchronize a timing to clamp the sheathing clamping portion onto the one end of the one of the wires with a timing to clamp the sheathing clamping portion onto the other end of the one of the wires.

As a fifth aspect of the present invention, in the structure with any one of the above second to fourth aspects, the terminals transferred by at least one of the pair of transferring means are of pressure welding terminals each having a pair of pressure welding edges and being accommodated in respective grooves provided in parallel on an insulative body, and an wire pressure welding blade to pressure-weld one or the other end of the one of the wires is formed on the corresponding wire connecting portion.

According to the present invention with the above first aspect, each wire having the terminals and thereby forming the sub-harness is tested in a manufacturing process of the sub-harness. That is, the terminal is electrically connected to the wire at each connecting unit, the wire connecting portion is kept in contact with the terminal in a state of the wire connecting portion having clamped the sheathing clamping portion, and the conductivity between the clamping punch portions of the respective wire connecting portions is checked. That is, a circuit (i.e. one clamping punch portion—one sheathing clamping portion—wire—the other sheathing clamping portion—the other clamping punch portion) for the conductivity test is formed, whereby each wire having the terminals and composing the sub-harness is tested.

According to the present invention with the above second aspect, since the conductivity testing means is arranged between the clamping punch portions of the respective wire connecting portions of the pair of connecting units, each wire having the terminals and composing the sub-harness can be tested. And, the circuit for the conductivity test is formed by making the clamping punch portions contact with the respective sheathing clamping portions of the wire. By this, each wire having the terminals and composing the sub-harness can be tested by means of the conductivity testing means.

According to the present invention with the above third aspect, since the wire connecting portion can hold the terminal in a state of the sheathing clamping portion being clamped, while keeping in contact with the sheathing clamping portion, even if there is a timing gap of the operation between the wire connecting portions of the pair of connecting units, either one of the wire connecting portions can wait for the other, while keeping in contact with the sheathing clamping portion of the terminal.

According to the present invention with the above fourth aspect, the sheathing clamping portions to be connected to the respective ends of the wire can be clamped simultaneously. Therefore, the test can be carried out simultaneously with the clamping of the sheathing clamping portions.

According to the present invention with the above fifth aspect, at least one connecting unit of the pair of connecting units can be used as a pressure welding unit.

The above and other objects and features of the present invention will become more apparent from the following description taken in conjunction with the accompanying drawings.

BRIEF DESCRIPTION OF THE DRAWINGS

FIG. 5A is a front view of the pressure welding apparatus at an initial state; FIG. 5B is a front view of the pressure welding apparatus in a state of carrying out the pressure welding for the connector table of right stage; and FIG. 5C is a front view of the pressure welding apparatus in a state of carrying out the pressure welding for the connector table of left stage;

FIG. 6A is a plan view of the sub-harness manufactured on the left stage; and FIG. 6B is a plan view of the sub-harness manufactured on the right stage;

FIG. 10A is a front view showing a state of the slider being positioned at the top dead point; FIG. 10B is a front view showing a state of the slider being positioned in the middle of the top and bottom dead points; and FIG. 10C is a front view showing a state of the slider being positioned at the bottom dead point;

DESCRIPTION OF THE PREFERRED EMBODIMENT(S)

An embodiment of the present invention will now be described in further detail with reference to the accompanying drawings.

Figure 1:
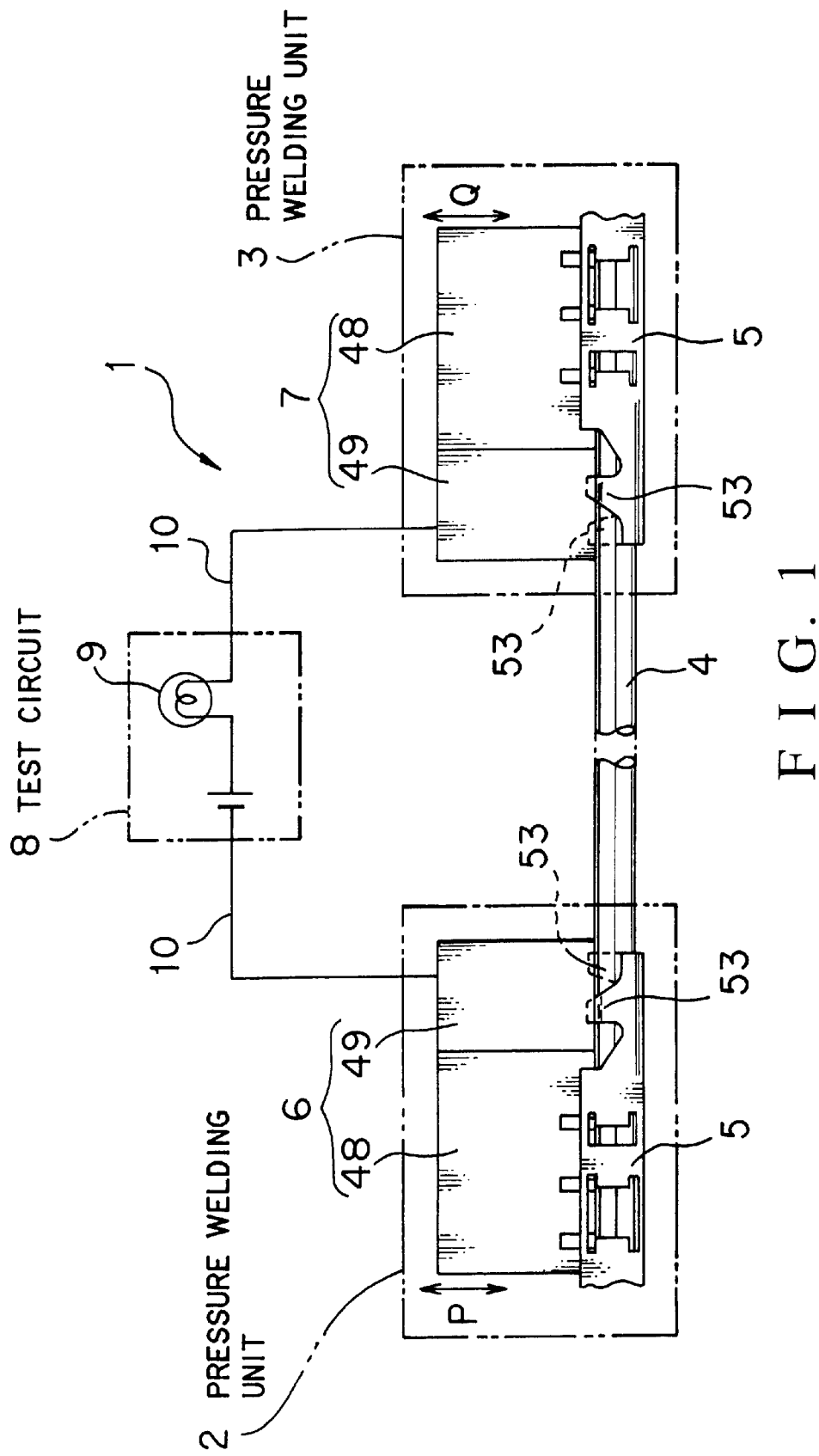
FIG. 1 is a schematic diagram showing an embodiment of a sub-harness manufacturing apparatus in accordance with the present invention.
Figure 2:
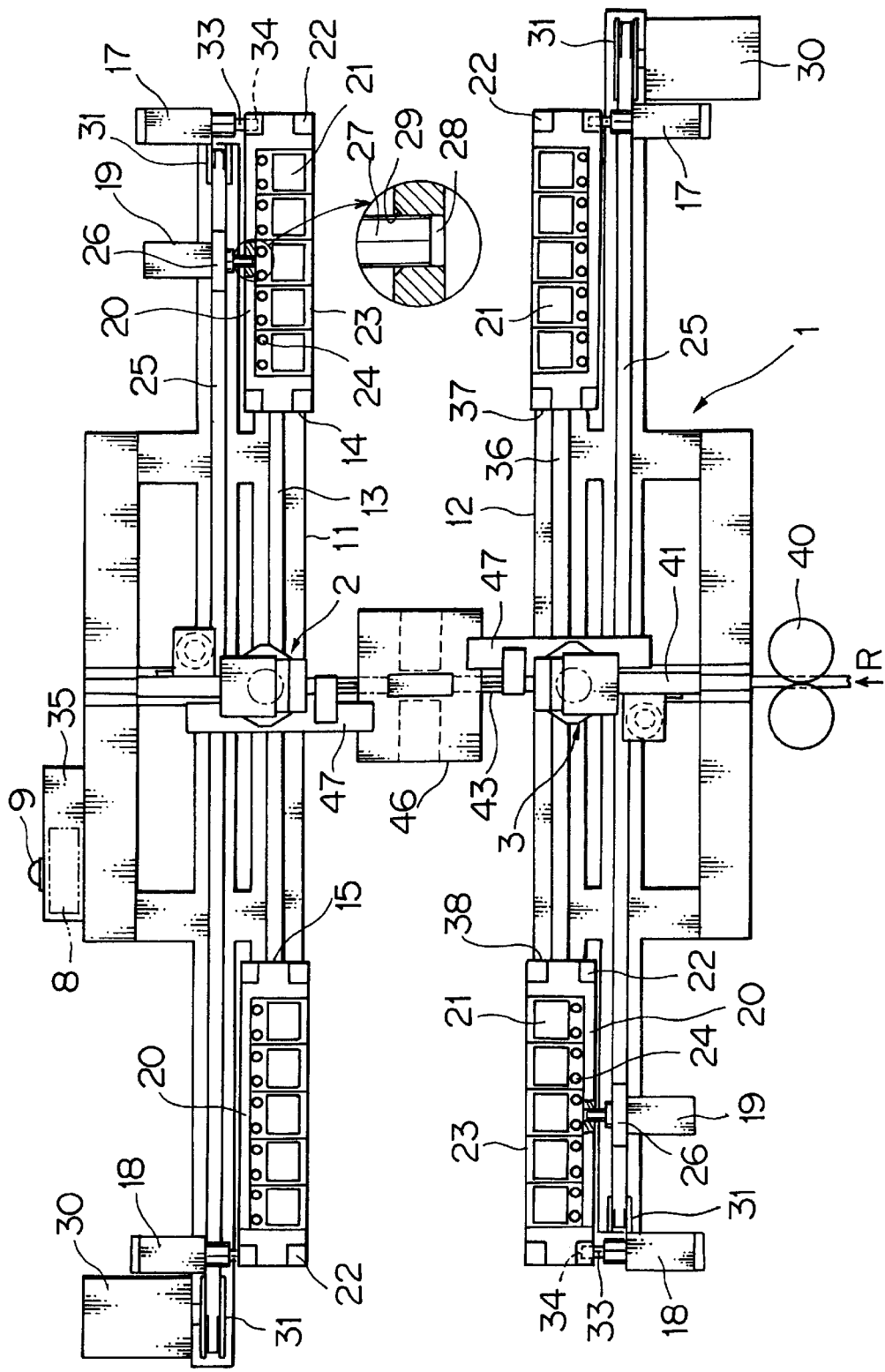
FIG. 2 is a plan view of the pressure welding apparatus.
Figure 3:
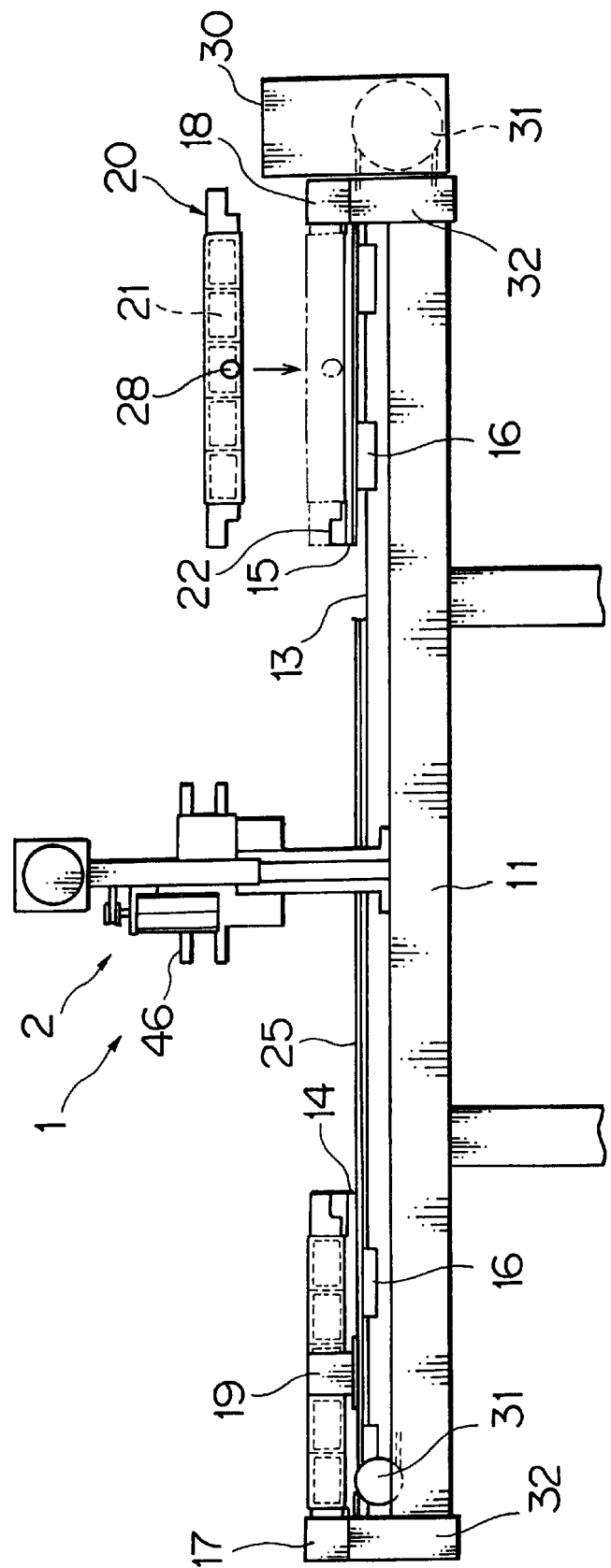
FIG. 3 is a front view of the pressure welding apparatus.
Figure 4:
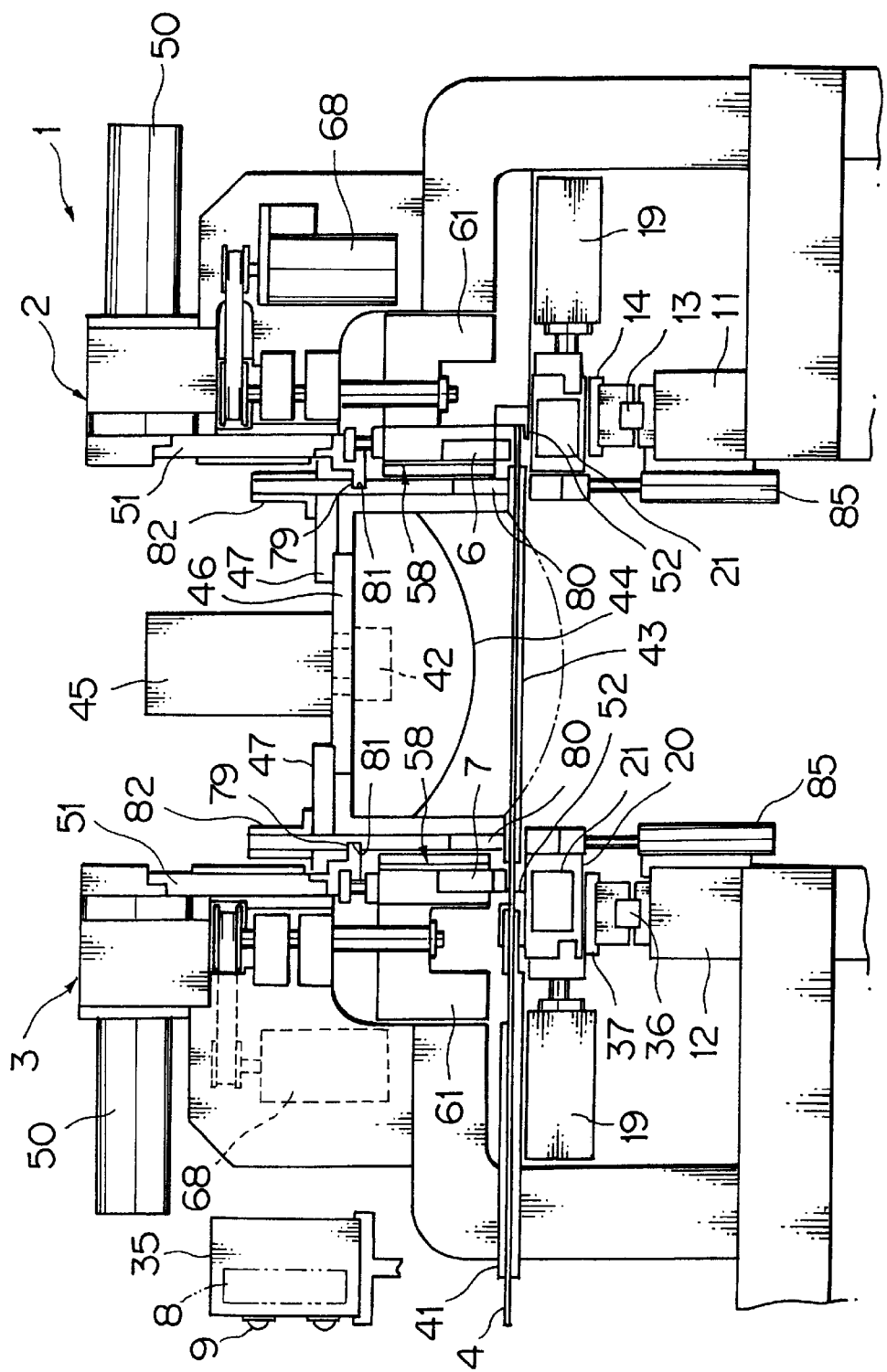
FIG. 4 is a side view of the pressure welding apparatus.

FIG. 1 is a schematic diagram showing an embodiment of a sub-harness manufacturing apparatus in accordance with the present invention. FIG. 2 is a plan view of the pressure welding apparatus. FIG. 3 is a front view of the pressure welding apparatus. And, FIG. 4 is a side view of the pressure welding apparatus.

In FIG. 1, reference character 1 designates a pressure welding apparatus as an example of the sub-harness manufacturing apparatus. The pressure welding apparatus 1 has a pair of pressure welding units 2,3 (connecting units). The pressure welding apparatus 1 may be called a random pressure welding unit. The pressure welding unit 2 is provided with a wire connecting portion 6 vertically-movably in an allow P direction (i.e. up and down direction) to pressure-weld one end of the supplied wire 4 to a pressure welding terminal 5 having a pair of pressure welding edges. And, the pressure welding unit 3 is provided with a wire connecting portion 7 vertically-movably in an allow Q direction (i.e. up and down direction) to pressure-weld the other end of the supplied wire 4 to the pressure welding terminal 5. The wire connecting portions 6,7 are made of conductive metal.

The wire 4 is one of a plurality of wires composing the sub-harness. Both ends of the wire 4 are pressure-weld to the respective pressure welding terminals 5 by means of the pressure welding units 2,3. And, upon the secure connection, a conductivity testing portion 8 (a conductivity testing means) to test or examine good or bad of the connection makes a lamp 9 turn on. On the contrary, in case of conductivity defectiveness, a later-described non-shown controlling portion, for example, raises an alarm instead of turning on the lamp 9.

The conductivity testing portion 8 has test circuits 10 connected to the respective wire connecting portions 6,7 by an appropriate means. On connecting (i.e. by pressure-welding and clamped) the wire 4 to the pressure welding terminals 5, the circuit formed of the wire connecting portion 6, the pressure welding terminal 5, the wire 4, the pressure welding terminal 5, the wire connecting portion 7, and the conductivity testing portion 8 is closed, and the lamp 9 turns of when the connection is good.

The pressure welding apparatus 1 in accordance with the present invention features the conductivity testing portion 8 as a conductivity testing means, which enables the wire 4 composing the sub:harness to be tested in the manufacture process of the sub-harness.

Referring to FIGS. 2–4, the structure of the pressure welding apparatus 1 is described in more detail.

As in FIG. 2 or FIG. 3, the pressure welding apparatus 1 has a pair of frames 11,12, the pressure welding unit 2 arranged in the general center of the frame 11, and the pressure welding unit 3 arranged in the general center of the frame 12. Here, the frame 11 is arranged in front of an operator, and the frame 12 is arranged behind the operator. The frames 11,12 are arranged symmetrically with each other and perpendicularly to the wire feeding direction (an allow R direction). The pressure welding units 2,3 are arranged in the wire feeding direction (the allow R direction).

The frame 11 is formed laterally long and horizontally. A guide rail 13 is arranged on the frame 11 along it. The guide rail 13 is provided with a right and left pair of connector tables 14,15 slidably with ML guides 16. Referring to FIG. 2, the frame has right and left stages (Reference numerals are not designated). In an initial state, the connector table 14 is arranged on the above left stage, and the connector table 15 is arranged on the above right stage.

The connector tables 14,15 are arranged on respective sides of the frame 11, while connector tables 14, 15 can be fixed, by means of respective fixing cylinders 17, 18. And, the connector tables 14, 15 can be transferred just under the pressure welding unit 2 by means of a moving cylinder 19. The fixing cylinders 17, 18 are of air type, for example, and can be changed to an appropriate fixing means. Also, the moving cylinder 19 is of air type and can be changed to an appropriate transferring means. The moving cylinder 19 corresponds to a transferring means in Claims. The transferring means may be defined as the whole structure of the frame 11. This is the same as for the frame 12.

The connector tables 14, 15 are formed in the same size. And, connector holding bars 20 are arranged on the respective connector tables 14, 15. A plurality of (for example five, but not limited thereto) connectors 21 are arranged on the connector holding bar 20 in parallel. The connector 21 has a plurality of pressure welding terminals 5 (FIG. 1) and an electrical insulator (i.e. a connector housing, whose reference character being omitted) to parallelly-arrange these.

The connector tables 14, 15 each have a frame portion 22 consisting of a plurality of rectangular pillars on both ends thereof, and a general rectangular connector holding bar 20 is arranged inside the frame portion 22 attachably and detachably. The connector holding bar 20 is disclosed in Japanese Patent Application Laid-open No. 9-306257. Connector holders 23 corresponding to the connectors 21 in various sizes are fixed with bolts 24 to the connector holding bar 20 in parallel detachably. The connectors 21 in desirable shapes can be arranged at random by changing position of the connector holder 23. The connector holders 23 have the same outside dimension, and shape of each connector supporting portion thereof is different according to various form of the connectors 21. The connector holding bars 20 have the same dimension and therefore are applicable to any of the connector tables 14, 15 plus later-described connector tables 37,38 of the frame 12.

Meanwhile, a timing belt 25 is arranged on the frame 11 in a longitudinal direction thereof. And, the moving cylinder 19 is secured to the timing belt 25 through a bracket 26. The front end portion of a rod 27 of the moving cylinder 19 enters an engaging hole 28 arranged in the middle portion of the connector holding bar 20 on each of the connector tables 14,15 so that the connector tables 14, 15 can shift alone the guide rail 13.

The engaging hole 28 on the connector holding bar 20 improves the positioning accuracy of the connector 21 against the pressure welding unit 2. This is the same for the pressure welding unit 3 on the frame 12. The engaging hole 28 has a curved slideway 29 for the rod 27. The connector tables 14, 15 are positioned at a determined position by the fixing cylinders 17, 18, and the rod 27 of the moving cylinder 19 catches the engaging hole 28 accurately.

A servomotor 30 is arranged on one end of the frame 11 so that the timing belt 25 can precisely move by a desirable distance through the timing pulleys 31. The drive of the servomotor 30 is carried out based on position data inputted in a non-shown controlling portion in advance. The connector tables 14, 15 are shifted or transferred from the end portions of the frame 11 to the center thereof (that is, from the above left stage to the center, and from the above right stage to the center) and positioned just under the pressure welding unit 2 accurately. The connector tables 14,15 each can move when the locking by the fixing cylinders 17,18 are released. The fixing cylinders 17, 18 are fixed to respective stays 32, and the ends of respective rods 33 engage engaging holes 34 of the connector tables 14,15. The above mechanism is the same as later-described connector tables 37, 38.

The above non-shown controlling portion is provided in a control unit 35 arranged, for example, on the front portion of the frame 11. In the control unit 35, the above conductivity testing portion 8 is provided. The controlling portion controls a later-described various servomotors such as the servomotor 30. On the face of the control unit 35, the above lamp 9, a non-shown indicating portion, and a non-shown operating portion, which are controlled by the controlling portion, are provided. A so-called pilot lamp and the like are arranged on an appropriate position outside the control unit 35.

The servomotor 30 can shift the connector tables 14, 15 accurately so that the wire 4 (FIG. 4) can be pressure-weld at random to the pressure welding terminal 5 (FIG. 1) in the connector 21. The timing belt 25 may be replaced with a ball screw.

The frame 12 has almost the same structure as the above-described the frame 11. The frame 12 is described similarly to the above-described frame 11.

The frame 12 is formed laterally long, horizontally, and in parallel to the frame 11. A guide rail 36 is arranged on the frame 12 along it. The guide rail 36 is provided with a right and left pair of connector tables 37,38 slidably with ML guides 16. Referring to FIG. 2, the frame has right and left stages (Reference numerals are not designated). In an initial state, the connector table 37 is arranged on the above left stage, and the connector table 38 is arranged on the above right stage.

The connector tables 37,38 are arranged on respective sides of the frame 12, while connector tables 37,38 can be fixed by means of respective fixing cylinders 17, 18. And, the connector tables 37,38 can be transferred just under the pressure welding unit 3 by means of a moving cylinder 19.

The connector tables 37,38 are formed in the same size. And, connector holding bars 20 are arranged on the respective connector tables 37,38. A plurality of (for example five, but not limited thereto) connectors 21 are arranged on the connector holding bar 20 in parallel. The connector tables 37,38 each have a frame portion 22 consisting of a plurality of rectangular pillars on both ends thereof, and a general rectangular connector holding bar 20 is arranged inside the frame portion 22 attachably and detachably.

Meanwhile, a timing belt 25 is arranged on the frame 12 in a longitudinal direction thereof. And, the moving cylinder 19 is secured to the timing belt 25 through a bracket 26. The connector tables 37,38 can shift along the guide rail 36.

A servomotor 30 is arranged on one end of the frame 12 so that the timing belt 25 can precisely move by a desirable distance through the timing pulleys 31. The connector tables 37,38 are shifted or transferred from the end portions of the frame 12 to the center thereof (that is, from the above left stage to the center, and from the above right stage to the center) and positioned just under the pressure welding unit 3 accurately.

Behind the pressure welding unit 3 of the frame 12, a scaling roller 40 is arranged. The scaling roller 40 sends forth the wire 4 (FIG. 4) in the allow R direction (the above-described the wire feeding direction). The wire 4 sent forth from the scaling roller 40 crosses the frame 12 along the wire guide 41 and, as shown in FIG. 4, reaches the frame 11 along the wire guide 43 being openable-and-closable by a horizontal cylinder 42. That is, when the wire 4 has been sent forth by the scaling roller 40 (FIG. 2) in a state that the connector tables (14 and 37, for example) are positioned just under the respective pressure welding units 2,3, the front end portion of the wire 4 comes to be positioned on the connector 21 of the connector table 14 of the frame 11. And, a middle portion of the wire 4 comes to be positioned on the connector 21 of the connector table 37 of the frame 12.

Reference character 44 designates a pushing-down member in use for sending forth the wire 4 by a determined length by the scaling roller 40 (FIG. 2). And, reference character 45 designates a pushing-down member driving cylinder. These are provided on a center table 46. The center table 46 is connected to both the frames 11, 12 with arms 47. The wire guide 43 and the pushing-down member 44 are disclosed in Japanese Patent Application Laid-open No. 7-161437.

Over the wire 4, the above wire connecting portions 6,7 consisting of the wire pressure welding blade 48 (FIG. 1) an d the clamping punch portion 49 (FIG. 1) are arranged. The clamping punch portion 49 may be formed separately from the wire pressure welding blade 48. When the sliders 51 drop with the drive of the respective servomotors 50 of the pressure welding units 2,3, the wire connecting portions 6,7 are simultaneously drop by being pushed by the sliders 51, and the wire 4 is pushed down. The wire 4 is cut with cutters 52, and simultaneously the ends of the wire 4 are pressure-welded to the connectors 21 by the wire pressure welding blades 48 (FIG. 1).

Returning to FIG. 1, the clamping punch portion 49 clamps a pair of sheathing clamping portions 53 provided on the rear end portion of the pressure welding terminal 5. The wire 4 is held more tightly by the pressure welding terminal 5 through the insulative sheathing by clamping the sheathing clamping portions 53. The circuit for the above conductivity test is closed with the contact of the clamping punch portion 49 and the sheathing clamping portions 53, and the lamp 9 turns on if the connection is good.

In FIG. 4, the pressure welding units 2,3 are positioned symmetrically, and the structures are almost the same. The pressure welding units 2,3 are described in detail later, especially for the pressure welding unit 2.

Here, a manufacture process (a manufacture method) of the sub-harness by using the above pressure welding apparatus 1 is described, referring to FIG. 5. The description is done for the pressure welding unit 2 (taken from the pressure welding unit 3 side; the right side in FIG. 5 corresponding to the left stage).

Figure 5A:
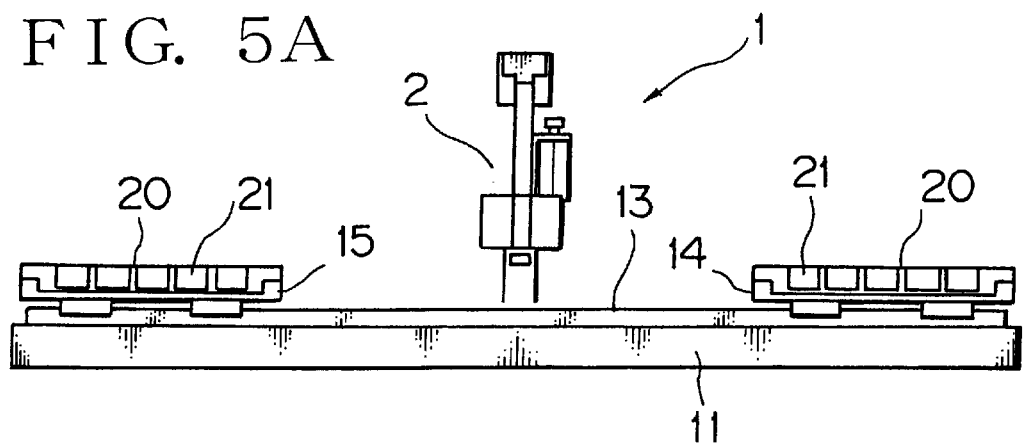
FIGS. 5A–5C are front views showing a manufacture process of the sub-harness.

First, as shown in FIG. 5A, in a state that the connector tables 14,15 are positioned on both sides of the frame 11, the connector holding bar 20 is set in the connector table 14 on the left stage. Suitable connectors 21 are arranged in advance on the connector holding bar 20. The setting of the connectors 21 can be carried out at another process for example, wherein various shapes, for example, of connectors 21 are manually or automatically mounted on various connector holding bars 20 according to various sub-harnesses.

Figure 5B:
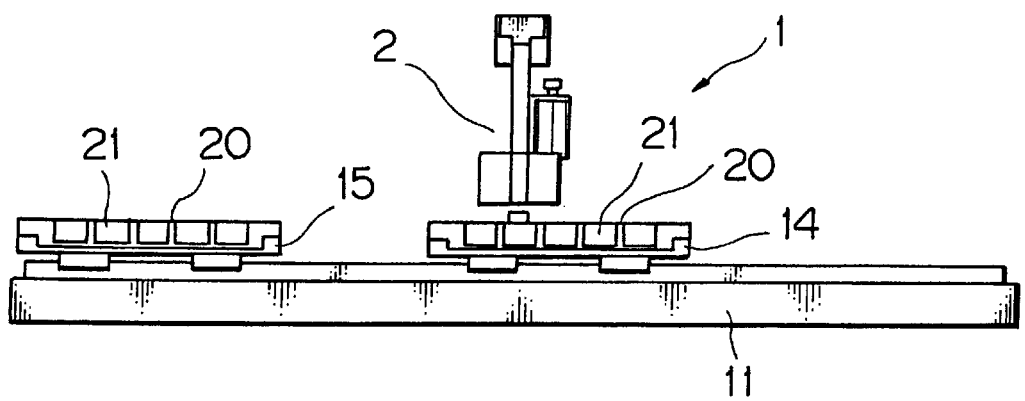

Next, by removing the locking by the fixing cylinder 17 (FIG. 2), as shown in FIG. 5B, the connector table 14 on the left stage shift is shifted just under the pressure welding unit 2 by driving the servomotor 30 (FIG. 2) and the timing belt 25. And, the wire 4 (FIG. 4) is pressure-welded to each of the connectors 21 on the connector table 14. That is, the wire 4 (FIG. 4) is connected the corresponding the pressure welding terminal 5 (FIG. 1) by means of the servomotor 30 (i.e. the connection process). Meanwhile, the connector holding bar 20 is set on the connector table 15 on the right stage. Various connectors 21 are arranged on the connector table 15 on the right stage as stated above.

Figure 5C:
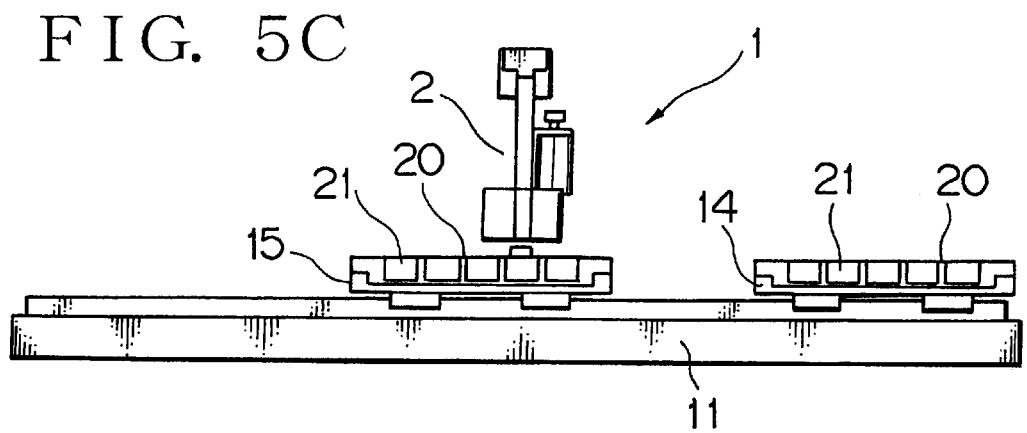

After completion of pressure-welding the wires 4 (FIG. 4) to the various connectors 21 on the connector table 14 on the left stage, while testing the conductivity, as shown in FIG. 5C, the connector table 14 is returned to the original position, and the connector table 15 is shifted just under the pressure welding unit 2. And, the wires 4 (FIG. 4) are pressure-welded to the connectors 21 on the connector table 15 on the right stage, while testing the conductivity, similarly to the above. Simultaneously, the connector holding bar 20 is removed from the connector table 14 on the left stage, and another connector holding bar 20 is set on the connector table 14 on the left stage.

After completion of pressure-welding the wires 4 (FIG. 4) to the connectors 21 on the connector table 15 on the right stage, while testing the conductivity, as shown in FIG. 5B, the connector table 15 is returned to the original position, and the connector table 14 is shifted just under the pressure welding unit 2. This operation is repeated. By the above, time from the connector setting to the connector removal is shortened in a great deal.

Figures 6A, 6B:
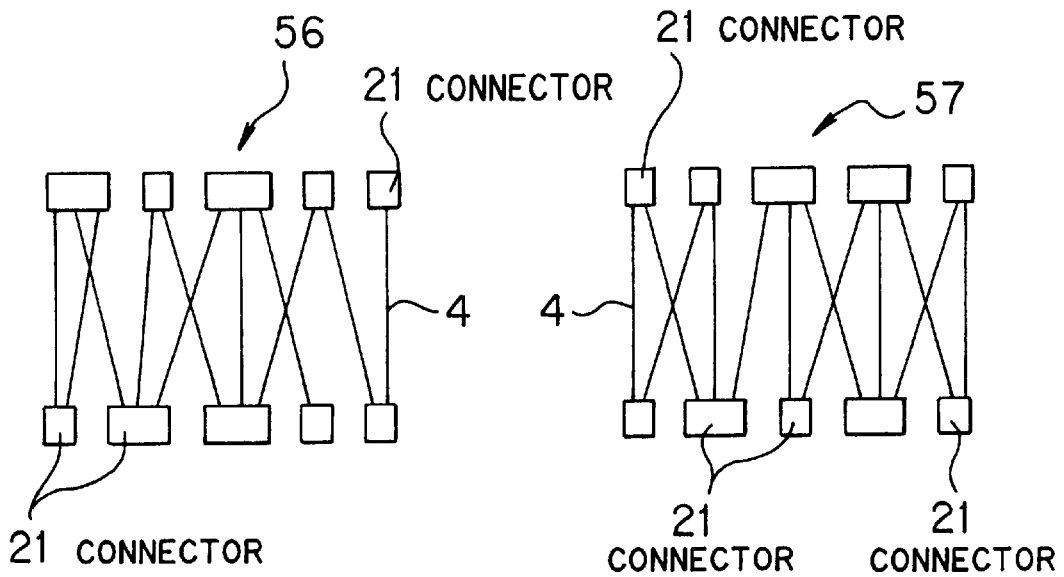
FIGS. 6A–6B are plan views of the sub-harness.

Here, as shown in FIG. 2, since two pairs of connector tables 14,15 and 37,38 are used, two different sub-harnesses can be obtained by using the right and left connector groups, i.e. connectors on the connector tables 14,37 and on the connector tables 15,38. FIGS. 6A–6B are plan views of the sub-harness. And, a sub-harness 56 of FIG. 6A is manufactured by using the connector tables 14,37 of the left stage of the frames 11,12 (FIG. 2). And, a sub-harness 57 of FIG. 6B is manufactured by using the connector tables 15,38 of the right stage of the frames 11,12 (FIG. 2). In FIG. 2, The wires 4 (FIG. 4) are pressure-welded to various connectors 21 on a state that the connector tables 14,37 and the connector tables 15,38 are arranged just under the respective pressure welding units 2,3. Here, the sub-harnesses 56,57 of FIGS. 6A, 6B differ each other in kind and arrangement of the connectors 21 and arrangement of the wires 4 (FIG. 4). An crossing arrangement of the wires 4 (FIG. 4) can be done by shifting one connector table by a distance of one connector.

Meanwhile, as shown in FIG. 2, since the connector holding bars 20 are arranged on the respective connector tables 14,15,37,38 on the frames 11,12 attachably and detachably, it is not necessary to change arrangement of the connectors, thereby enabling the sub-harnesses 56,57 (FIG. 6) to be manufactured quickly and securely. And, as stated above, different sub-harnesses are obtained on the respective right and left stages of the pressure welding units 2,3, the set production (i.e. a method of direct manufacturing) can be done. And, for enabling the wires 4 (FIG. 4) to be quickly pressure-weld to the various sizes and shapes of the connectors 21, a plurality (6 kinds, but not limited thereto) of applicators 58 (FIG. 7) slidably having different wire connecting portions 6 (and the wire connecting portions 7, FIG. 1) are rotatably arranged on the present pressure welding apparatus 1. The rotatably applicator is disclosed in Japanese Patent Application Laid-open No. 10-41041.

Figure 7:
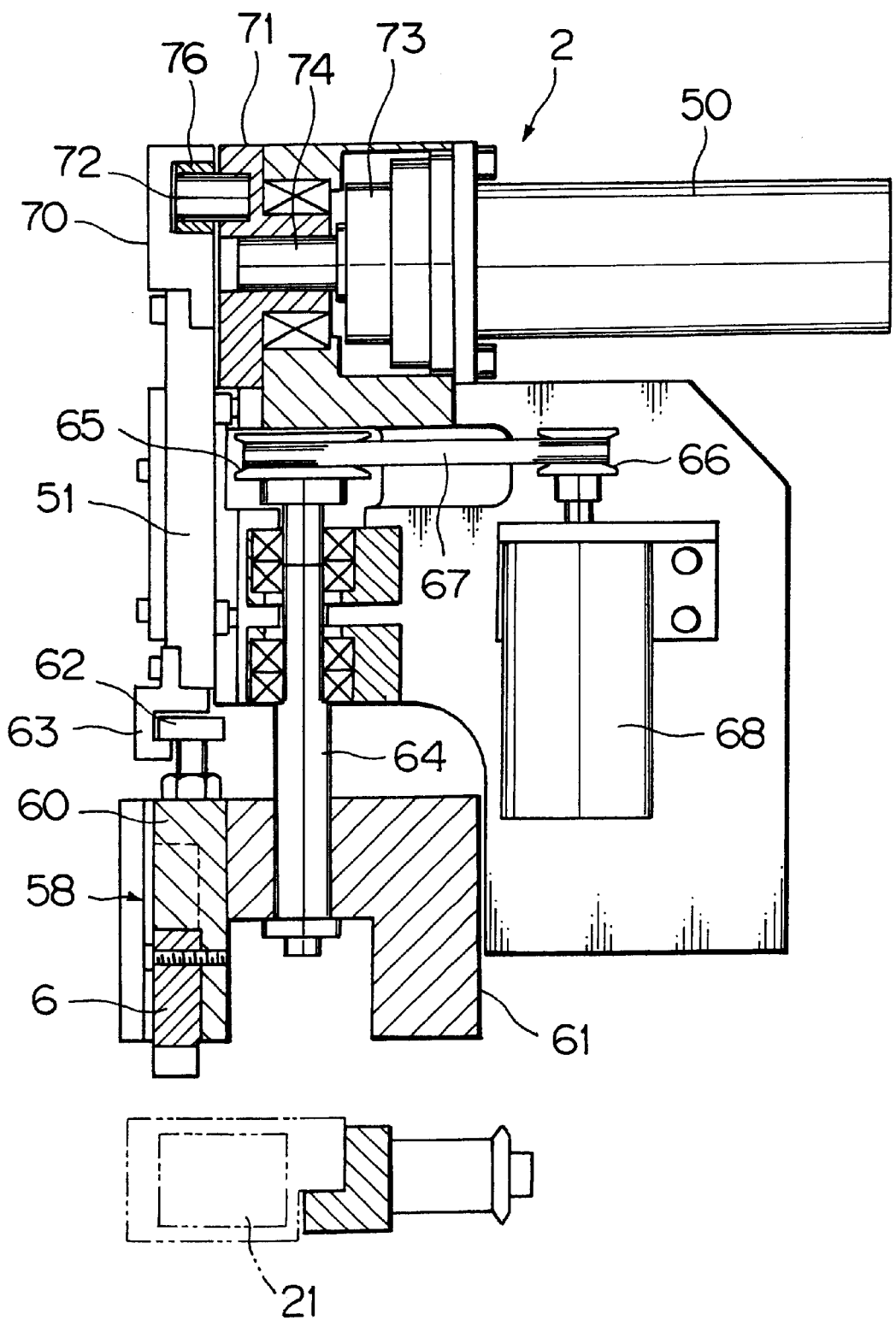
FIG. 7 is a side view of the pressure welding unit of the pressure welding apparatus.

Next, the pressure welding unit 2 is described, referring to FIG. 7. As shown in FIG. 7, the wire connecting portion 6 is fixed to a shank 60. The shank 60 is provided on a rotor 61 vertically-movably. A head 62 of the shank 60 engages a claw portion 63 of a slider 51 and disengages when the rotor 61 turns. The rotor 61 is fixed to a rotary shaft 64. The rotary shaft 64 is connected to the servomotor 68 through the timing belt 67 and the pulleys 65,66. The wire connecting portion 6 is guided by a blade guide 69 (FIG. 9) which is being pushed by a spring (not shown) and is freely movable vertically.

Figure 8:
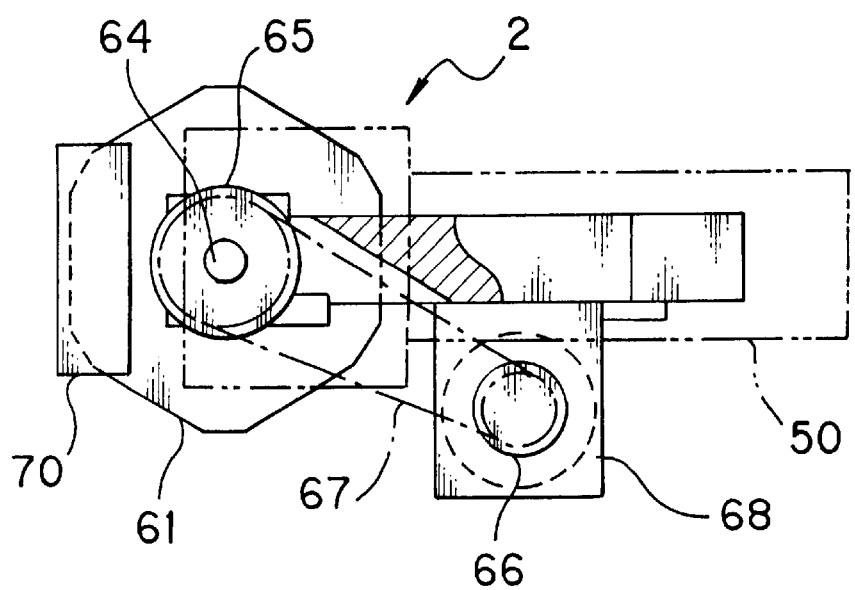
FIG. 8 is a plan view of the pressure welding unit.

The applicators 58 have the respective wire connecting portions 6 with different sizes and shapes and the respective shanks 60 and are arranged on respective six planes (FIG. 8) of the rotor 61. The applicators 58 (FIG. 7) are attachable on and detachable from the rotor 61 by bolts and therefore can be replaced with other ones. And, a rotary wire feeder (not shown) to feed the wires 4 (a cf. FIG. 4) of various diameters is arranged behind the scaling roller 40 of FIG. 2, the wire 4 (FIG. 4) is changed according to kind and size of the pressure welding terminal 5 (FIG. 1) of the connector 21, and the wire connecting portion 6 meeting the wire diameter is suitably selected by means of the rotary applicator 58 (FIG. 7).

Figure 9:
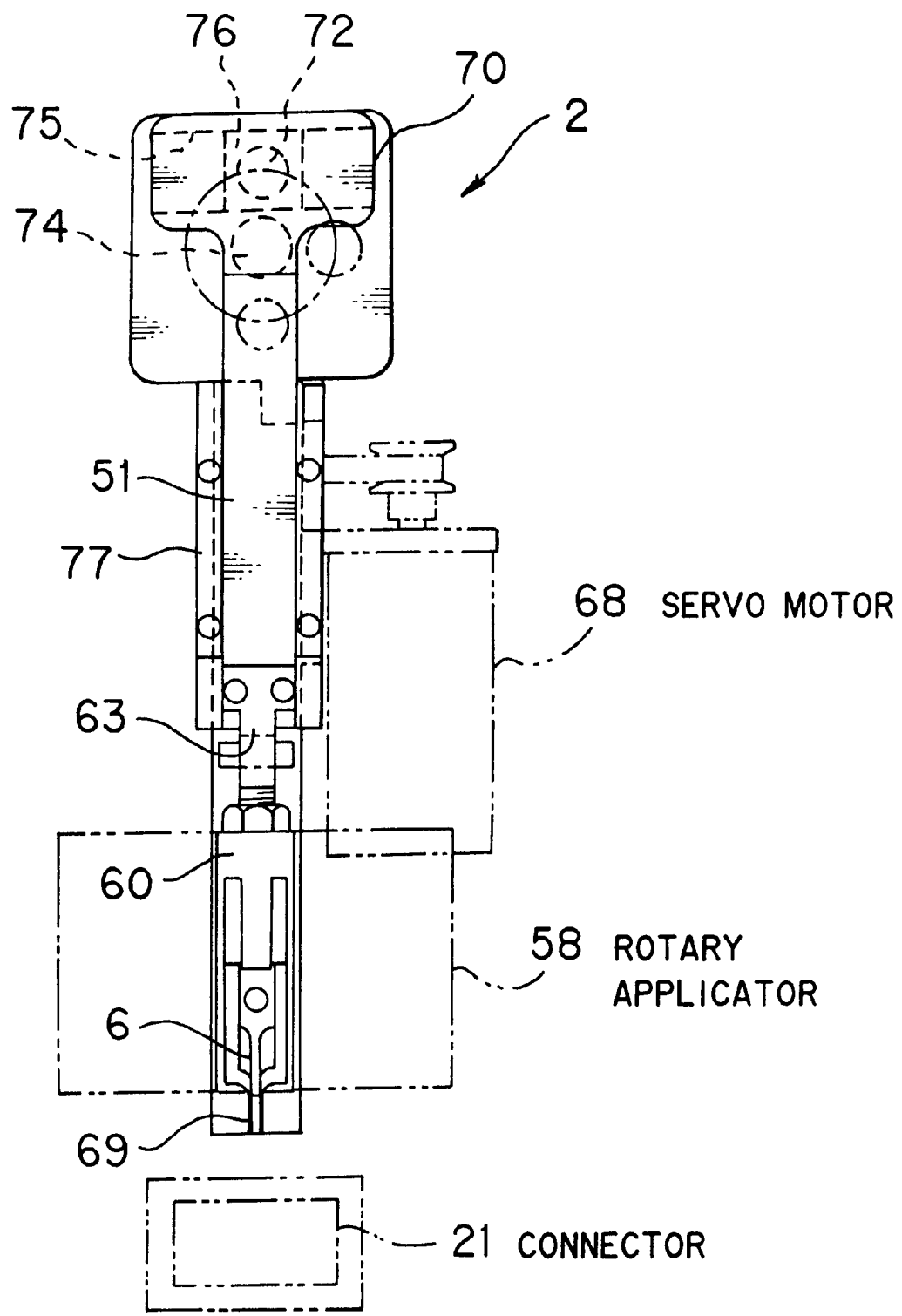
FIG. 9 is a front view of the pressure welding unit.

The slider 51 in FIG. 7 is connected to a T-like cam body 70 as shown in FIG. 9. The cam body 70 is connected to an eccentric shaft 72 of a rotary plate 71 (FIG. 7). The rotary plate 71 (FIG. 7) is connected to a rotary shaft 74 of a deceleration portion 73 of the servomotor 50 as shown in FIG. 7. In FIG. 9, the eccentric shaft 72 engages a horizontal groove 75 of the cam body 70 through the slider 76 horizontally slidably. While turning the rotor 61 (FIG. 7) by rotation of the servomotor 50 (FIG. 7), the eccentric shaft 72 shifts in the horizontal groove 75 of the cam body 70, whereby the cam body 70 goes up and down along with the slider 51. The slider 51 shifts vertically along a guide 77.

Figures 10A, 10B, 10C:
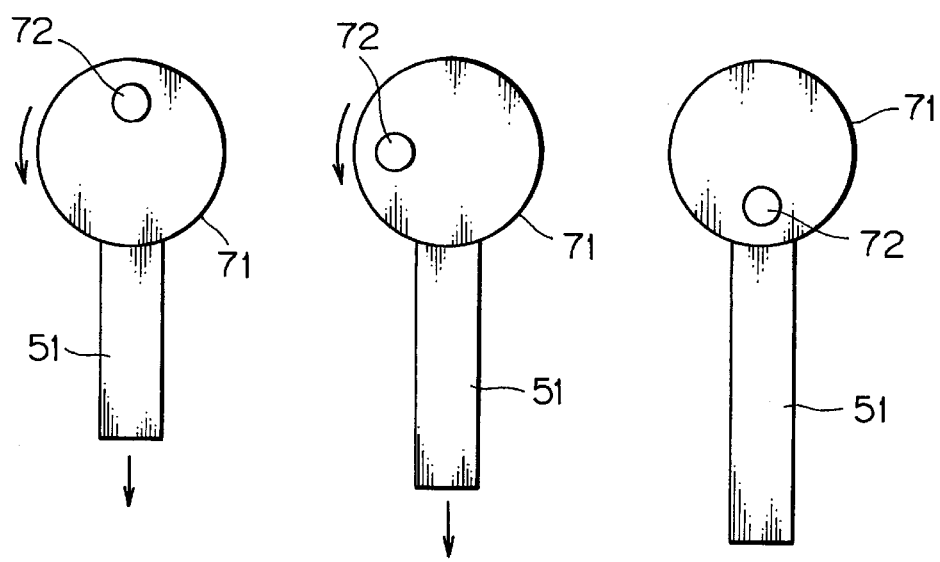
FIGS. 10A–10C are front views showing movement of a rotary plate and a slider of the pressure welding unit.

The rotary plate 71 (FIG. 7) can turn in a range of 0–360 degrees. And, as shown in FIGS. 10A–10C, the slider 51 drops down to the bottom dead point (FIG. 10C) with the turning of 0–180 degrees and climbs up to the top dead point (FIG. 10A) with the turning of 180–360 degrees. As stated above, the slider 51 and the wire connecting portion 6 (FIG. 7) go up and down integrally. The next stroke of the slider 51 is obtained by reversely turning the rotary plate 71 by the servomotor 50 (FIG. 7).

By using the above up and down mechanism, various connectors with various pressure welding stroke (i.e. pressure welding height) can be applied. That is, the stroke of the wire connecting portion 6 (FIG. 7) can be freely changed by changing the rotation angle of the rotary plate 71. For example, when the rotary plate 71 of FIG. 10B is turned by 90 degrees and reversely turned, the stroke of the slider 51, namely the wire connecting portion 6 (FIG. 7), is 1/2 of the case of 180 degrees (FIG. 10C). Accordingly, it is not necessary to change arrangement of the connectors, thereby enabling the sub-harnesses to be manufactured quickly and securely.

By controlling the rotation of the servomotor SO (FIG. 7) by a non-shown controlling portion, the wire connecting portion 6 (FIG. 7) can be kept in contact with the sheathing clamping portion 53 (FIG. 1) of the pressure welding terminal 5 (FIG. 1) until the completion of the conductivity test. That is, even if there is a gap of operation between the pressure welding units 2, 3, an upward movement of the wire connecting portion 6 (FIG. 7) can be kept waiting, while keeping in contact with the sheathing clamping portion 53 (the same is applied to the pressure welding unit 3). Here, if the servomotor 50 (FIG. 7) is controlled by the non-shown controlling portion so that the sheathing clamping portions 53 (FIG. 1) can be simultaneously clamped by the respective pressure welding unit 2, 3, the manufacture time can be shortened.

In FIG. 4, groove portions 81 of wire pushers 80 engage respective claw portions 79 of the sliders 51 of the pressure welding units 2,3, which wire pushers 80 are vertically arranged between the wire connecting portions 6,7. The wire pushers 80 are supported by holders 82 vertically slidably. And, as shown in FIG. 11 (only the pressure welding unit 3 side is described hereinafter), a wire pusher end 83 of each pusher 80 is positioned closely over the wire 4.

And, a wire receiver 84 is arranged just closely under the wire 4 and opposite the bottom of the wire pusher 80. The wire receiver 84 is fixed to the end of a vertical rod 86 of an air cylinder 85 and is vertically movable along with the movement of the rod 86. The air cylinder 85 is fixed to the frame 12 (FIG. 4) positions the wire receiver 84 just under the wire 4 in the most extended state of the rod 86. The wire pusher 80 and the wire receiver 84 are formed in a rod-like, blade-like, or block-like shape, for example.

Figure 12:
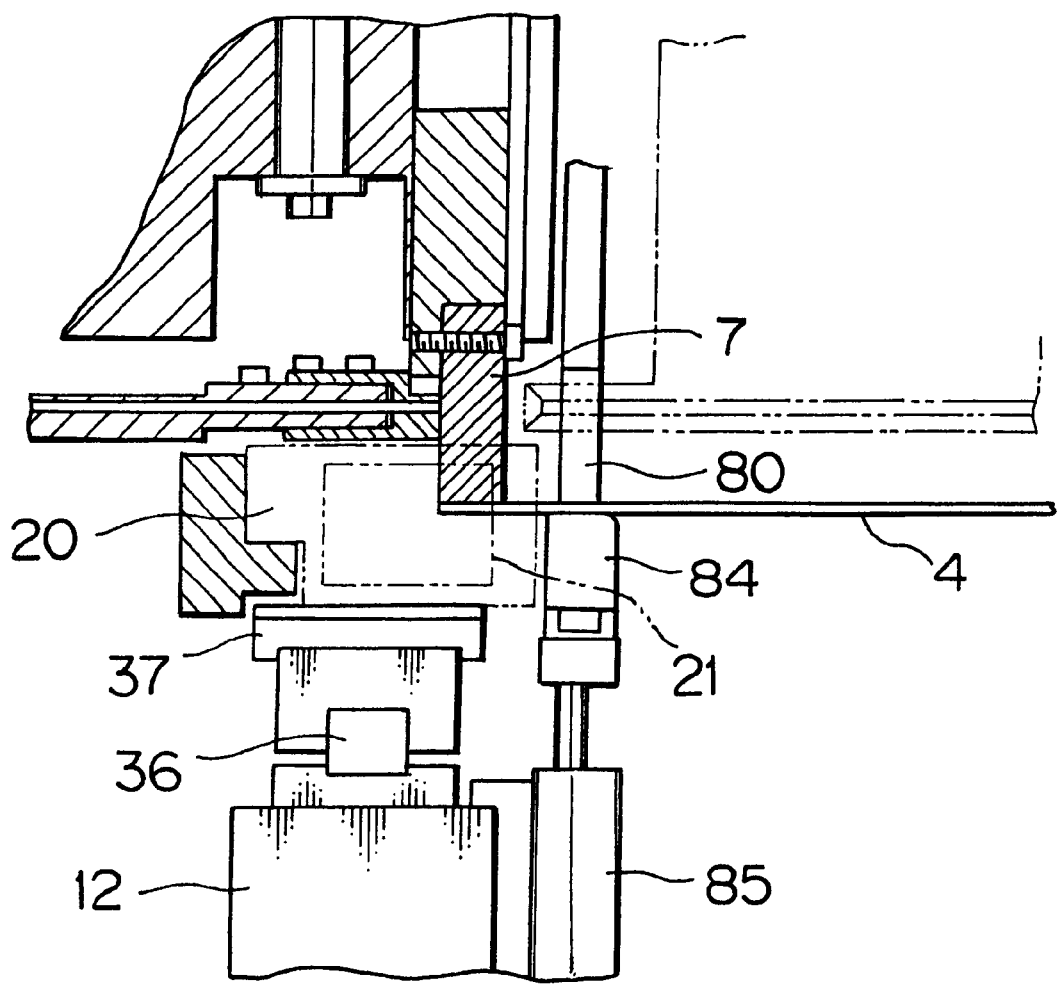
FIG. 12 is a side view of the pressure welding unit showing a state of the wire having been pressure-welded to the connector from the state of FIG. 11.

When the wire pusher 80 drops along with the wire connecting portion 7, the wire 4 is cut with the edge portion (upper edge) 87 of the wire connecting portion 7 and the cutter (lower edge) 52. And, simultaneously, as shown in FIG. 12, the wire 4 is tightly put between the wire pusher 80 and the wire receiver 84 positioned just under the wire 4. And, also simultaneous, the air cylinder 85 is decompressed supports the wire 4 as a weak spring. Otherwise, the air cylinder 85 with a weaker pressure than the force by the wire pusher 80 may be used so that the wire receiver 84 can be lowered by the wire pusher 80.

Figure 11:
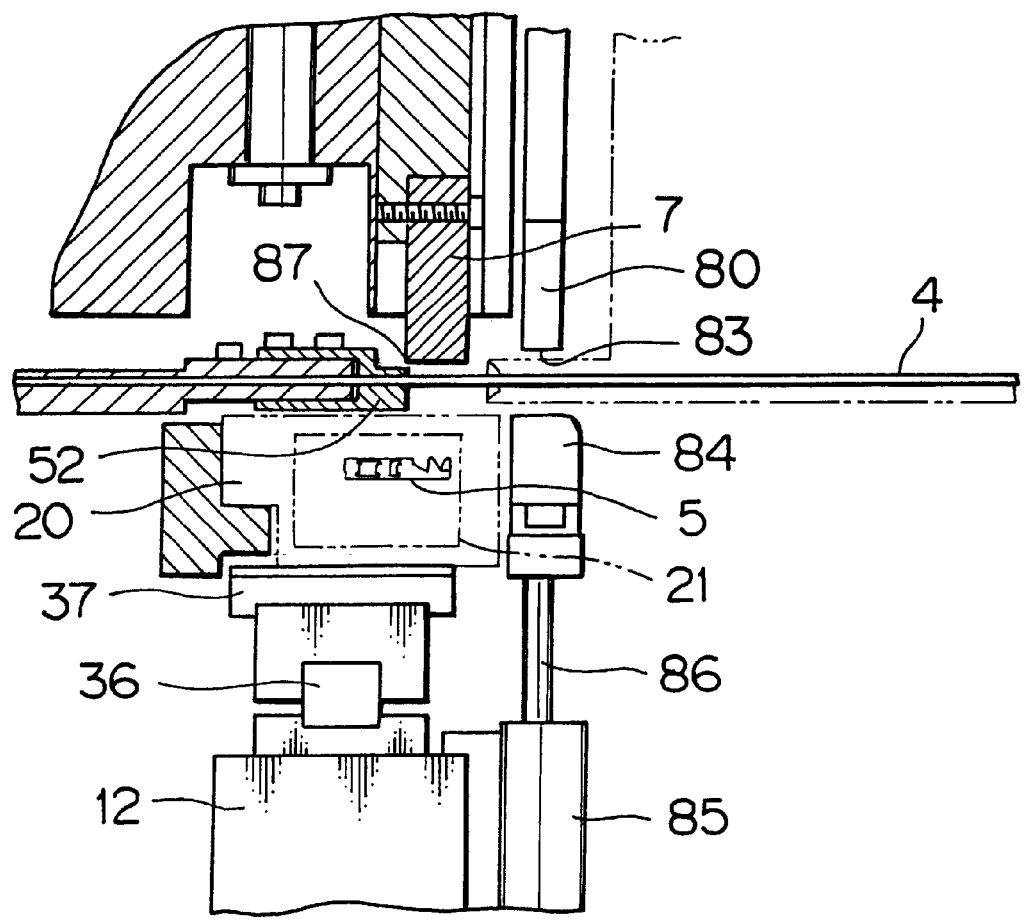
FIG. 11 is a partly sectional side view of a wire pusher and a wire receiver of the pressure welding unit.

The wire receiver 84 can rise up to, a position just under the wire 4 from a state of FIG. 11. The wire 4 is axially fixed straight by the cutter 52 (FIG. 11), the wire pusher 80, and the wire receiver 84.

And, the wire 4 drops integrally with the wire connecting portion 7 in a state being held between the wire pusher 80 the wire receiver 84 and is securely pressure-welded to a corresponding pressure welding terminal 5 (FIG. 11) of the connector 21 by means of the wire connecting portion 7. After the pressure welding (namely, after the conductivity test), only the wire connecting portion 7 and the wire pusher 80 go up, and the air cylinder 85 is completely decompressed drops so that the wire 4 is not pushed up by the wire receiver 84. When the wire 4 has separated from the wire receiver 84 by the horizontal movement of the connector table 37 (or the connector table 38), the wire receiver 84 starts rising as shown in FIG. 11.

As described above, since the conductivity testing portion 8 is arranged between the wire connecting portions 6,7 (i.e. the clamping punch portions 49), each wire 4 with the pressure welding terminals 5 to form the sub-harnesses 56, 57 can be tested. Therefore, the sub-harnesses 56,57 can be manufactured, while being effectively tested. And, the cost can be reduced.

Tough the conductivity testing method for the sub-harness and the sub-harness manufacturing apparatus are described for the pressure welding apparatus hereinabove, the method and apparatus is applicable to the following. That is, since the above-described test can be applied to a terminal having a sheathing clamping portion, the testing method can be applied after a sub-harness has been manufactured by an apparatus which can pressure-weld a terminal to at least one end of a wire.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A sub-harness manufacturing apparatus, comprising:
   a pair of connecting units each having a wire connecting portion, made of metal, vertically movable so as to connect one end of one of a plurality of wires comprising a sub-harness to one of a plurality of terminals having a sheathing clamping portion and being arranged in a wire feeding direction;

a pair of transferring means to transfer the terminals in a direction perpendicular to the wire feeding direction so as to position each one of the plurality of terminals under each wire connection portion;

a clamping punch portion provided on the wire connecting portion of each of the pair of connecting units for clamping the sheathing clamping portion;

a conductivity testing means arranged between the clamping punch portions of the pair of connecting units for judging whether the one of the plurality of wires having terminals on the respective ends thereof is good or bad; and a controlling means for synchronizing a timing to clamp the sheathing clamping portion onto the one end of the one of the wires with a timing to clamp the sheathing clamping portion onto the other end of the one of the wires.

2. The sub-harness manufacturing apparatus as set forth in claim 1, wherein each of the pair of connecting units is provided with a holding means to keep the clamping punch portion in contact with the sheathing clamping portion.

3. The sub-harness manufacturing apparatus as set forth in claim 2, wherein the terminals transferred by at least one of the pair of transferring means are of pressure welding terminals each having a pair of pressure welding edges and being accommodated in respective grooves provided in parallel on an insulative body, and a wire pressure welding blade to pressure-weld one or the other end of the one of the wires is formed on the corresponding wire connecting portion.

4. The sub-harness manufacturing apparatus as set forth in claim 2, wherein the terminals transferred by at least one of the pair of transferring means are of pressure welding terminals each having a pair of pressure welding edges and being accommodated in respective grooves provided in parallel on an insulative body, and a wire pressure welding blade to pressure-weld one or the other end of the one of the wires is formed on the corresponding wire connecting portion.

5. The sub-harness manufacturing apparatus as set forth in claim 1, wherein the terminals transferred by at least one of the pair of transferring means are of pressure welding terminals each having a pair of pressure welding edges and being accommodated in respective grooves provided in parallel on an insulative body, and a wire pressure welding blade to pressure-weld one or the other end of the one of the wires is formed on the corresponding wire connecting portion.

6. The sub-harness manufacturing apparatus as set forth in claim 1, wherein the terminals transferred by at least one of the pair of transferring means are of pressure welding terminals each having a pair of pressure welding edges and being accommodated in respective grooves provided in parallel on an insulative body, and a wire pressure welding blade to pressure-weld one or the other end of the one of the wires is formed on the corresponding wire connecting portion.

* * * * *